(12) United States Patent
Baldo et al.

(10) Patent No.: US 8,134,214 B2
(45) Date of Patent: Mar. 13, 2012

(54) ELECTRONIC DEVICE, SYSTEM, AND METHOD COMPRISING DIFFERENTIAL SENSOR MEMS DEVICES AND DRILLED SUBSTRATES

(75) Inventors: Lorenzo Baldo, Bareggio (IT); Chantal Combi, Oggiono (IT); Mario Francesco Cortese, Sa Donato Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 152 days.

(21) Appl. No.: 12/508,869

(22) Filed: Jul. 24, 2009

(65) Prior Publication Data

US 2009/0278215 A1    Nov. 12, 2009

Related U.S. Application Data

(63) Continuation-in-part of application No. PCT/EP2008/000495, filed on Jan. 23, 2008.

(30) Foreign Application Priority Data

Jan. 24, 2007  (IT) .............................. MI2007A0099

(51) Int. Cl.
*H01L 29/84* (2006.01)
(52) U.S. Cl. ................. 257/415; 257/680; 257/E21.001
(58) Field of Classification Search .................. 257/415, 257/680, E21.001
See application file for complete search history.

(56) References Cited

U.S. PATENT DOCUMENTS

| 4,763,098 A | 8/1988 | Glenn et al. |
| 2005/0253207 A1 | 11/2005 | Garcia |

FOREIGN PATENT DOCUMENTS

| DE | 10059813 | * | 6/2002 |
| DE | 10059813 | A1 | 6/2002 |
| EP | 1775259 | A1 | 10/2005 |
| WO | 9805935 | | 2/1998 |
| WO | 0029822 | | 5/2000 |
| WO | 03067657 | | 8/2003 |
| WO | 2006061025 | | 6/2006 |

OTHER PUBLICATIONS

European Patent Office, International Search Report, International Application No. PCT/EP2008/000495, Oct. 17, 2008, 6 Pages.

* cited by examiner

*Primary Examiner* — Tan N Tran
(74) *Attorney, Agent, or Firm* — Graybeal Jackson LLP

(57) ABSTRACT

Electronic device which comprises a substrate provided with at least one passing opening, a MEMS device with function of differential sensor provided with a first and a second surface and of the type comprising at least one portion sensitive to chemical and/or physical variations of fluids present in correspondence with a first and a second opposed active surface thereof, the first surface of the MEMS device leaving the first active surface exposed and the second surface being provided with a further opening which exposes said second opposed active surface, the electronic device being characterized in that the first surface of the MEMS device faces the substrate and is spaced therefrom by a predetermined distance, the sensitive portion being aligned to the passing opening of the substrate, and in that it also comprises a protective package, which incorporates at least partially the MEMS device and the substrate so as to leave the first and second opposed active surfaces exposed respectively through the passing opening of the substrate and the further opening of the second surface.

48 Claims, 4 Drawing Sheets

ELECTRONIC DEVICE, SYSTEM, AND METHOD COMPRISING DIFFERENTIAL SENSOR MEMS DEVICES AND DRILLED SUBSTRATES

PRIORITY CLAIM

The present application is a Continuation-In-Part of copending International Application Serial No. PCT/EP2008/000495, filed Jan. 23, 2008, which claims the benefit of Italian Patent Application Serial No. MI2007A000099, filed Jan. 24, 2007; all of foregoing applications are incorporated herein by reference in their entireties.

TECHNICAL FIELD

Embodiments of the present disclosure relate to an electronic device comprising MEMS devices and drilled substrates, in particular of the land grid array (LGA) or ball grid array (BGA) type.

Embodiments of the disclosure particularly, but not exclusively, relate to an electronic device comprising MEMS differential sensors mounted on a LGA substrate, wherein the MEMS differential sensor needs a double physical interface of communication with the environment outside the electronic device and the following description is made with reference to this field of application by way of illustration only.

BACKGROUND

As it is well known, a MEMS device (micro-electro-mechanical system) is a micro device which integrates the mechanical and electrical functions in a silicon chip or die by using the lithographic techniques of micro manufacturing.

In particular, with reference to FIG. 1, a MEMS differential pressure sensor 100 is described which comprises a silicon die 101 formed by an annular portion 102 and a circular or squared membrane 103 coupled to the upper edge of the annular portion 102.

The lower edge of the annular portion 102 is connected to a protective package 104 of plastic, metallic or ceramic material by means of an adhesive layer 105.

The protective package 104 is formed by a housing, substantially cup shaped housing, which shows an internal cavity 106 wherein the die 101 is mounted. The protective package 104 is also provided with a passing opening 107. When the die 101 is mounted in the cavity 106, the annular portion 102 surrounds the passing opening 107, thereby the passing opening 107 realizes a first access gate of a first pressure P1 onto the lower surface of the membrane 103.

In a conventional way, the protective package 104 is realized through molding before the die 101 is glued inside the cavity 106.

The cavity 106 is then closet on top by a metallic or plastic cover 108 provided with an opening 109 for putting the cavity 106 in communication with the outside of the protective package 104.

In particular, this opening 109 realizes a second access gate for a second pressure P2 onto the upper surface of the membrane 103. The MEMS differential pressure sensor 100 is then able to measure differences of pressure between the first and the second pressure P1, P2.

Moreover, metallic pins 110 project from the protective package 104 for allowing the electric connection of the MEMS differential pressure sensor 100 with the outside of the protective package 104.

Connections 111 for electrically connecting the die 101 with the metallic pins 110 of the cavity 106 are realized though wire bonding, after the die 101 has been fixed in the cavity 106.

A protective coating layer 112, generally silicon gel, fills in almost completely the cavity 106.

In other known embodiments, also the cover 108 is formed through molding and coupled to the protective package 104 after that the MEMS differential pressure sensor 100 has been fixed in the cavity 106 and electrically coupled to the pins 111.

Although advantageous under several aspects, these embodiments of the assembled electronic devices comprising MEMS differential pressure sensor show the drawback of being cumbersome since the cavity 106 must be wide enough for housing the die 101 and allowing the alternative connection operations through wire bonding.

Therefore the manufacturing of these devices provides the following steps: manufacturing of the protective package 104 and of the cover 108, mounting and electric connection of the die 101 inside the protective package 104, mounting of the cover 108 on the protective package 104.

Since these process steps are not provided in the conventional process flow for the realization of integrated circuits cause a considerable increase of the costs of the final device.

The technical problem underlying embodiments of the present disclosure is that of devising an electronic device comprising MEMS differential sensor devices, having such structural characteristics as to realize this electronic device with manufacturing processes of conventional integrated circuits, overcoming the limits and/or drawbacks still limiting conventional electronic devices.

SUMMARY

A first embodiment of the present disclosure relates to an electronic device comprising a substrate having at least one passing opening; a differential sensor MEMS device having at least a first and a second surface leaving exposed a first and second active surface, respectively; a protective package incorporating at least partially said MEMS device and said substrate so as to leave exposed said first and second active surfaces; said differential sensor being sensitive to chemical and/or physical variations of fluids getting in contact with said first and/or second active surface; said first surface of said MEMS device facing said substrate and being spaced from said substrate by a distance; said second surface being opposed to said first surface and having an opening for exposing said second active surface; said sensitive portion being aligned with said passing opening of said substrate.

The characteristics and the advantages of the electronic device according to embodiments of the disclosure will be apparent from the following description of an embodiment thereof given by way of indicative and non limiting example with reference to the annexed drawings.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 1:
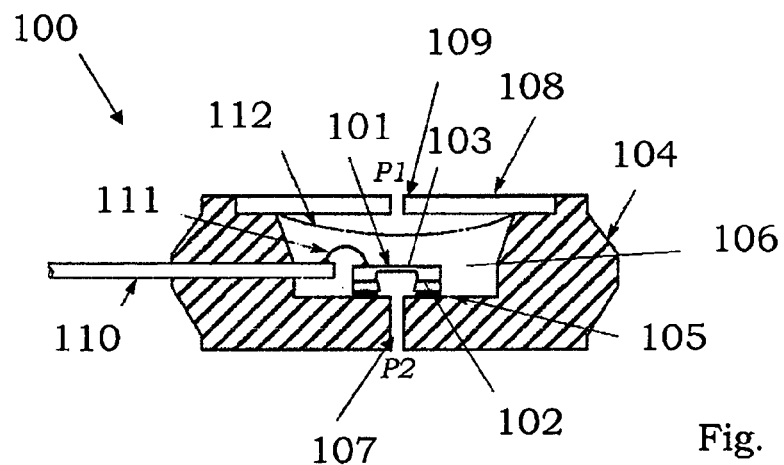
FIG. 1 is a sectional view of an embodiment of an electronic device comprising conventional MEMS differential pressure sensor devices.
Figure 2:
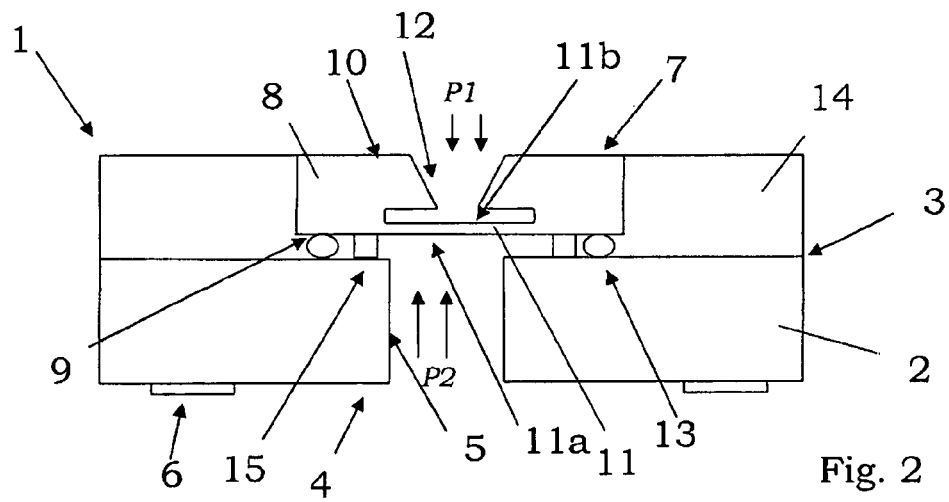
FIG. 2 is a sectional view of an electronic device comprising MEMS devices according to an embodiment of the disclosure.

With reference to FIG. 2, a first embodiment is shown of an electronic device 1 for MEMS differential sensor devices according to embodiments of the disclosure which comprises a substrate 2, for example of the LGA/BGA type, having an upper surface 3 and a lower surface 4 opposed to the upper surface 3, provided with a passing opening 5 between these two surfaces 3, 4.

In a known way a substrate of the LGA/BGA type is formed by conductive layers insulated from each other by means of layers of insulating or dielectric material. The conductive layers are conformed in conductive tracks insulated form each other by layers of insulating or dielectric material. Conductive holes, called "vias", are typically realized through the insulating layers with a vertical orientation with respect to the layers, to form conductive paths between conductive tracks belonging to different conductive layers.

Moreover, lands 6, coupled to conductive tracks present on the lower surface 4, are present on the lower surface 4 of the substrate 2.

The electronic device 1 also comprises a MEMS differential sensor device 7 comprising a die 8, for example of silicon, having a first surface 9 and a second surface 10 opposed to the first surface 9. On the first surface 9 a sensitive portion 11 of the MEMS differential sensor device 7 is integrated which leaves a first active surface 11a of the sensitive portion 11 exposed, while the second surface 10 is provided with an opening 12 which exposes a second active surface 11b, opposed to the first active surface 11a, of the sensitive portion 11.

According to embodiments of the disclosure, the first surface 9 of the MEMS differential sensor device 7 faces the upper surface 3 of the substrate 2 and is spaced therefrom by a determined distance and the sensitive portion 11 aligned to the opening 5.

Moreover, the peripheral portion of the first surface 9 of the MEMS differential sensor device 7 is provided with lands for the electric connection to conductive tracks present on the upper surface 3 of the substrate 2, by means of electric connections 13, for example bumps.

Advantageously, the MEMS differential sensor device 7 is electrically mounted on the substrate 2 by means of the known "flip-chip" assembling method.

Still according to embodiments of the disclosure, the electronic device 1 comprises a protective package 14, realized through molding, which incorporates the MEMS differential sensor device 7, the electric connections 13 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14 leaves also the lower surface 4 of the substrate 2 exposed.

Advantageously, the second surface 10 of the MEMS differential sensor device 7 is flanked to an upper surface of the protective package 14.

According to embodiments of the disclosure, the sensitive portion 11 is sensitive to chemical and/or physical variations of fluids present on or getting in contact with the two active surfaces 11a, 11b of the sensitive portion 11. The fluids can be at least two, in such a case a first fluid interacts with the first active surface 11a of the sensitive portion 11 of the MEMS differential sensor device 7 through the passing opening 5, and the second fluid interacts with the second active surface 11b of the sensitive portion 11 of the MEMS differential sensor device 7 through the opening 12 provided on the second surface 10.

Advantageously, a barrier element 15 is positioned between the first surface 9 of the MEMS differential sensor device 7 and the upper surface 3 of the substrate 2 so as to surround said sensitive portion 11.

Advantageously according to embodiments of the disclosure, the presence of this barrier element 15 protects the sensitive portion 11 during the manufacturing process of the protective package 14, though molding, so that this sensitive portion 11 remains free.

In fact, in a known way, the formation of the protective package 14 provides the introduction, inside a cavity of a mold, of the substrate 2 whereon the MEMS differential sensor device 7 is mounted.

In the mold cavity the injection is then provided, under pressure and at high temperature, of an electrically insulating material being melted, which will constitute the plastic body of the protective package 14. This material is typically a synthetic resin, for example an epoxy resin.

The proper molding step involves the injection of the resin into the cavity of the mold. This step is then followed by a cooling step for completing the protective package 14.

For avoiding that the resin damages the sensitive portion 11 of the MEMS differential sensor device 7 during the injection step of the resin, according to embodiments of the disclosure, between the upper surface 3 of the substrate 2 and the first surface 9, the barrier element 15 is provided which completely surrounds at least the sensitive portion 11 of the MEMS differential sensor device 7.

Advantageously, the barrier element 15 is a ring which completely surrounds the sensitive portion 11 of the MEMS device 7, when the MEMS device 7 is mounted on the substrate 2, and contacts the upper surface 3 of the substrate 2 and the first surface 9 of the MEMS differential sensor device 7.

Advantageously, the barrier element 15 is formed by a welding paste, thereby, in this embodiment, the electric connection step and the gluing step of the MEMS differential sensor device 7 to the substrate 2 are carried out at the same time, resulting in a particularly compact structure of simple realization, not needing critical alignments between different structures.

Moreover, the external edge of this barrier element 15 is, for example, completely incorporated in the protective package 14.

Figure 3:
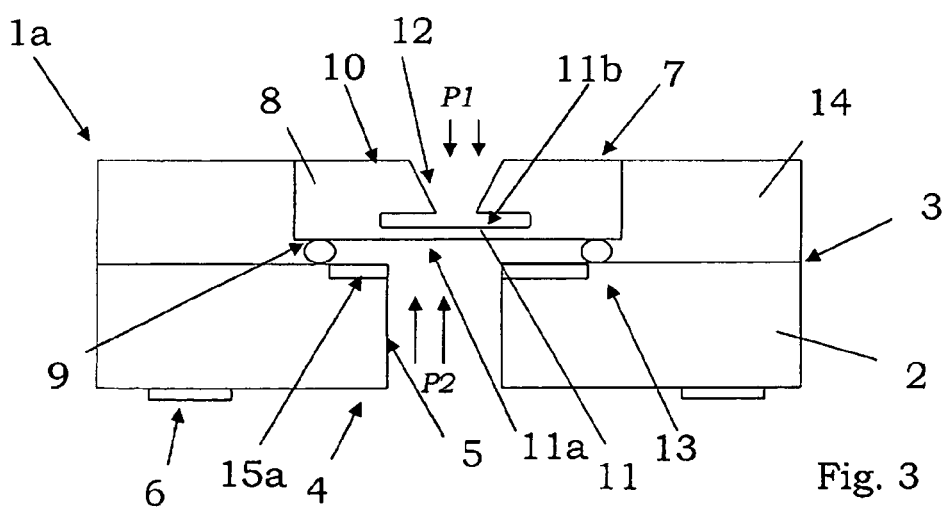
FIG. 3 is a sectional view of a first version of the electronic device of FIG. 2.

With reference to FIG. 3, a first embodiment is shown of an electronic device 1a according to embodiments of the disclosure.

Elements being structurally and functionally identical with respect to the electric device described with reference to FIG. 2 will be given the same reference numbers.

Advantageously, a barrier element 15a is positioned at least in an area which surrounds the sensitive portion 11.

In this first embodiment, the barrier element 15a is an irregular area 15a formed on the upper surface 3 of the substrate 2.

Advantageously, this irregular area 15a shows a corrugated surface.

Advantageously, this irregular area 15a extends on the upper surface 3 of the substrate 2 in correspondence with the whole central free area.

Advantageously, according to embodiments of the disclosure this irregular area 15a is obtained by modifying the chemical properties of the upper surface 3 of the substrate 2, as shown in FIG. 3.

Advantageously, the irregular area 15a is formed by a non wettable material.

Nothing forbids that this layer 15a of non wettable material is formed on the upper surface 3 of the substrate 2.

Figure 4:
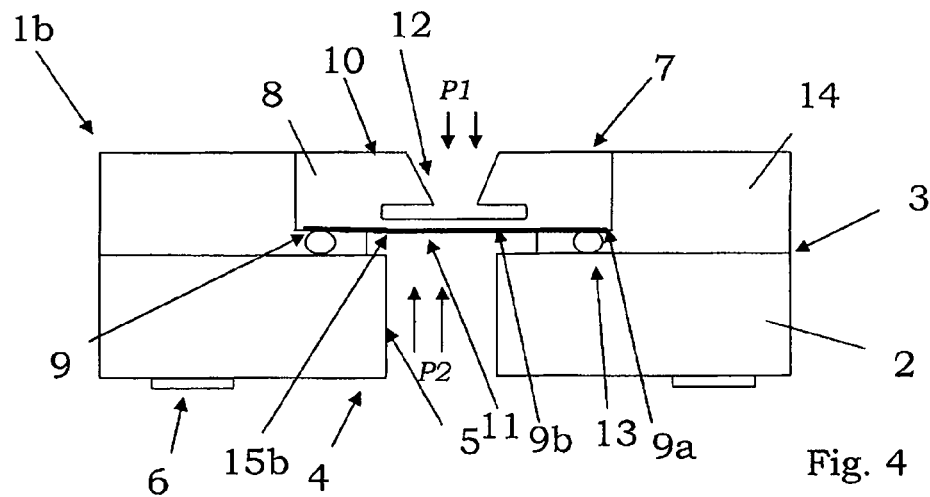
FIG. 4 is a sectional view of a second version of the device of FIG. 2.

With reference to FIG. 4, a second version of the embodiment of an electronic device 1b according to embodiments of the disclosure is shown.

Elements being structurally and functionally identical with respect to the device 1 described with reference to FIG. 2 will be given the same reference numbers.

Advantageously, a barrier element 15b is positioned at least in an area which surrounds the sensitive portion 11.

In this second version, the barrier element 15b is an irregular area 15b formed on the first surface 9 of the MEMS differential sensor device 7 and is obtained by modifying the chemical properties of the first surface 9 of the MEMS differential sensor device 7.

Advantageously, this irregular area 15b extends on the first surface 9 of the MEMS differential sensor device 7 in correspondence with the whole sensitive portion 11 of the MEMS differential sensor device 7.

It is in fact known that a silicon die 8, at least in correspondence with the first surface 9 of a MEMS differential sensor device 7, is coated by an insulating layer 9b of the non wettable type coated by a protection layer 9a comprising wettable material for example a plastic layer, for example comprising organic material such as Polyimide.

Advantageously, at least in correspondence with the sensitive portion 11 of the MEMS differential sensor device 7, the layer of wettable material 9a is removed leaving the insulating layer 9b, for example formed by silicon oxide, exposed.

Advantageously, after the removal step from the sensitive portion 11 of the MEMS differential sensor device 7 of the layer 9a of wettable material, the MEMS differential sensor device is welded onto the substrate 2 and is subjected to a cleaning operation, for example in Plasma, by using a gas mixture including argon and oxygen.

Advantageously, the oxygen of the cleaning mixture chemically reacts with the layer 9a of wettable material increasing the wettability, while the dielectric layer 9b which coats the sensitive portion 11 is inert to the treatment.

Therefore, as result after the treatment, an increased wettability is obtained of the layer 9a of wettable material, comparable to that of the upper surface 3 of the substrate 2 and a reduced wettability of the surface of the dielectric layer 9b which coats the sensitive portion 11.

This wettability difference implies a sudden slow down of the resin flow during the molding step of the protective package 14 thereby the superficial voltage of the resin leads to the formation of a meniscus around the peripheral surface of the dielectric layer 9b which covers the sensitive portion 11.

Nothing forbids that a barrier layer 9b of non wettable material is formed not only on the first surface 9 of the MEMS device, but also on the upper layer 3 of the substrate 2 aligned to the sensitive portion 11.

In a further version of these two latter embodiments of the disclosure the irregular area 15a, 15b shows wrinkles.

Advantageously, in the irregular area 15a, 15b trenches are formed, made in the substrate or in the MEMS differential sensor device 7, so as to realize a preferred path defined in the substrate 2 or on the MEMS differential sensor device 7 for the resin during the molding step.

Advantageously, these trenches completely surround the sensitive portion 11 of the MEMS device 7, as shown for example in the device 1c of FIG. 5, wherein elements being structurally and functionally identical with respect to the device 1 described with reference to FIG. 2 have been given the same reference numbers.

Advantageously, in this latter embodiment a layer of non wettable material can be present in correspondence with the sensitive portion 11 of the MEMS differential sensor device 7 in correspondence with the area enclosed by the trenches, both on the substrate 2 and on the MEMS differential sensor device 7.

According to embodiments of the disclosure, the presence of this irregular area 15a, 15b protects the sensitive portion 11 during the manufacturing step of the protective package 14, through molding, so that the liquid resin is uniformly distributed around the electric connections without reaching the sensitive portion 11.

Figure 6:
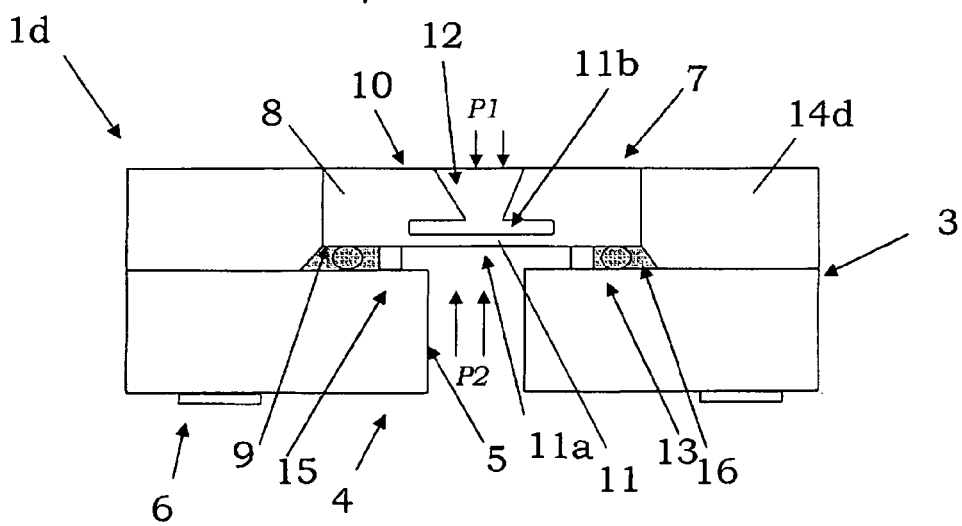
FIG. 6 is a sectional view of an electronic device comprising MEMS devices according to a second embodiment of the disclosure.

With reference to FIG. 6, a second embodiment of an electronic device 1d according to embodiments of the disclosure is shown.

Elements being structurally and functionally identical with respect to the device 1 described with reference to FIG. 2 will be given the same reference numbers.

In particular in this embodiment an underfiller 16 incorporates the electric connections 13 to mechanically strengthen the electronic device 1 in the connection area between the MEMS differential sensor device 7 and the substrate 2.

Advantageously, the underfiller 16 is formed by epoxy compounds, for example epoxy resin.

Advantageously, a barrier element 15 can be provided between the MEMS differential sensor device 7 and the substrate 2.

Advantageously, the underfiller 16 shows a tapered profile outwards of the MEMS differential sensor device 7, while it shows a substantially vertical profile in correspondence with the barrier element 15.

In other words, the cross section of the underfiller 16 increases when approaching the upper surface 3 of the substrate 2.

The electronic device 1d also comprises a protective package 14d, realized through molding, which incorporates the MEMS differential sensor device 7, the underfiller 16 and the substrate 2, leaving the first active surface 11a of the sensitive portion 11 of the MEMS differential sensor device 7 exposed through the passing opening 5 of the substrate 2 and the second active surface 11b exposed through the opening 12 of the second surface 10.

Advantageously, the protective package 14d leaves also the lower surface 4 of the substrate 2 exposed.

Advantageously, the second surface 10 is flanked to an upper surface of the protective package 14d.

The presence of the barrier element 15 allows maintaining the sensitive portion 11 of the MEMS differential sensor device 7 free from the underfiller 16.

Moreover, the underfiller 16 protects the first surface 9 of the MEMS differential sensor device 7 during the manufacturing step of the plastic package 14d.

Advantageously, the underfiller 16 is present outside the barrier element 15a, 15b of the embodiments described with reference to FIGS. 3, 4 and 5, at least in the area comprised between the upper surface 3 of the substrate 2 and the first surface 9 of the MEMS differential sensor device 7 so as to incorporate the electric connections 13 for mechanically strengthen the electronic device 1 in the connection area between the MEMS differential sensor device 7 and the substrate 2.

Figure 7:
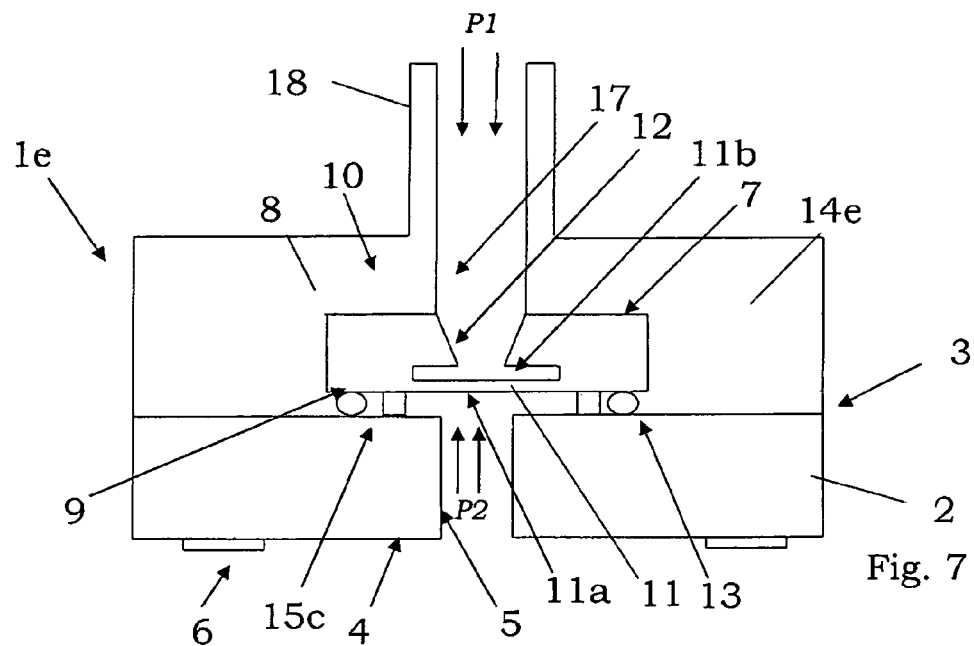
FIG. 7 is a sectional view of an electronic device comprising MEMS devices according to a third embodiment of the disclosure.

With reference to FIG. 7, a third embodiment of an electronic device 1e according to embodiments of the disclosure is shown.

Elements being structurally and functionally identical with respect to the device 1 described with reference to FIG. 2 will be given the same reference numbers.

The electronic device 1e also comprises a protective package 14e, realized through molding, which incorporates the MEMS differential sensor device 7 and the substrate 2, leaving the first active surface 11a of the sensitive portion 11 of the MEMS differential sensor device 7 exposed through the passing opening 5, and advantageously, the lower surface 4 of the substrate 2. The protective package 14e coats the second surface 10 of the MEMS differential sensor device 7 and is provided with a further passing opening 17 aligned to the opening 12 present on the second surface 10 of the MEMS differential sensor device 7.

Advantageously, a cylindrical projection 18 is formed on the passing opening 17 of the protective package 14e to facilitate the access to the sensitive portion 11 of the MEMS differential sensor device 7.

Advantageously, this cylindrical projection 18 is realized simultaneously with the protective package 14e during the same molding step in which this package is formed.

Advantageously, a barrier element 15 can be provided between the MEMS differential sensor device 7 and the substrate 2.

Figure 5:
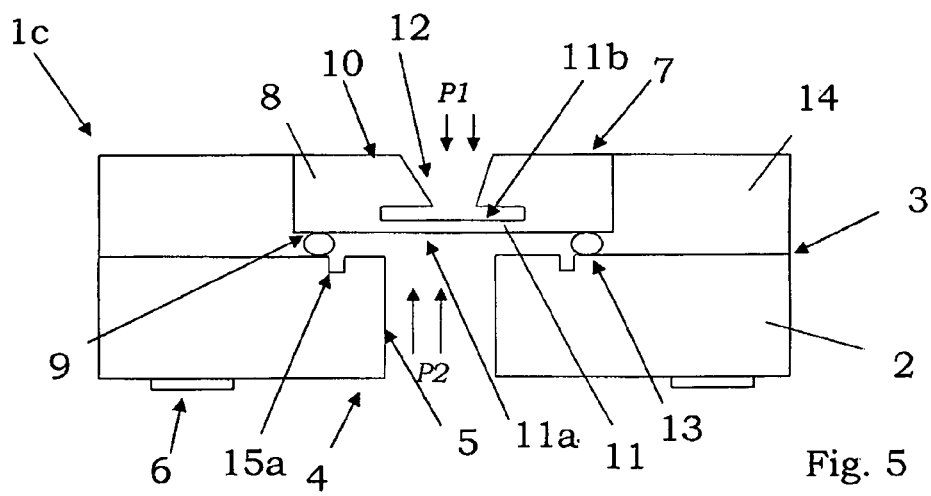
FIG. 5 is a sectional view of a third version of the device of FIG. 2.

Advantageously, also in this embodiment of the disclosure the barrier elements 15a and 15b shown with reference to FIGS. 3 to 5 or an underfiller 16 like the one shown with reference to FIG. 6 can be provided.

Figure 8:
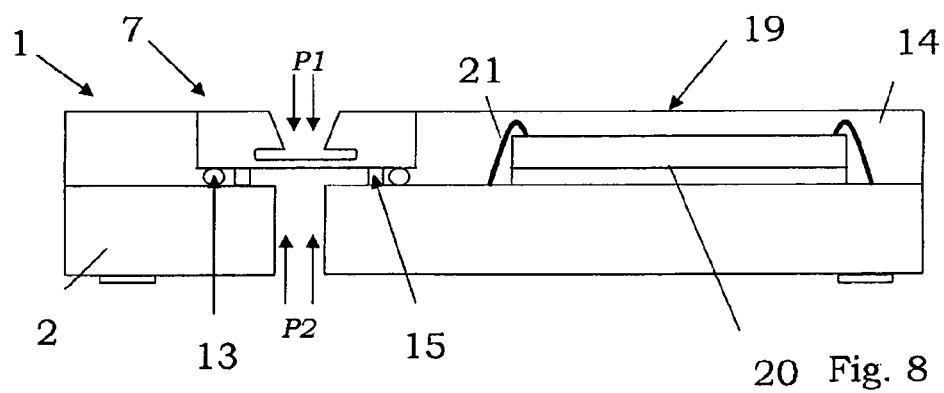
FIGS. 8 and 9 are sectional views of applications of the electronic devices comprising MEMS devices realized according to embodiments of the disclosure.

With reference to FIG. 8, the device 1 of FIG. 2 is shown wherein an integrated circuit 19 is mounted on the substrate 2 flanked to the MEMS differential sensor device 7, and fixed onto the substrate 2, for example by means of a welding layer 20.

The integrated circuit 19 is electrically coupled to the substrate 2 by means of further electric connections 21.

The protective package 14, realized through molding, incorporates the MEMS differential sensor device 7 with the electric connections 13, the integrated circuit 19 with the further electric connections 21 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14 leaves also the lower surface 4 of the substrate 2 exposed.

Advantageously, the second surface 10 of the MEMS differential sensor device 7 is flanked to an upper surface of the protective package 14.

Figure 9:
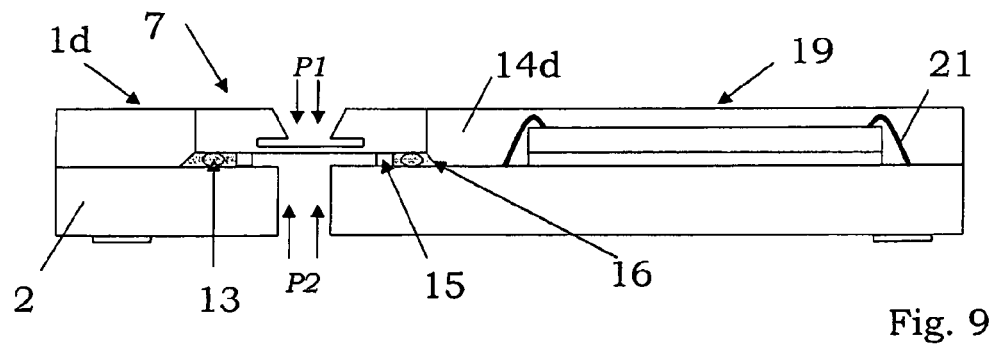

With reference to FIG. 9, the device 1d of FIG. 6 is shown wherein an integrated circuit 19 is mounted on the substrate 2 flanked to the MEMS differential sensor device 7, and fixed onto the substrate 2, for example by means of a welding layer 20.

The integrated circuit 19 is electrically coupled to the substrate 2 by means of further electric connections 21.

The protective package 14d, realized through molding, incorporates the MEMS differential sensor device 7, the underfiller 16, the integrated circuit 19 with the further electric connections 21 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14d leaves also the lower surface 4 of the substrate 2 exposed.

Advantageously, the second surface 10 of the MEMS differential device 7 is flanked to the upper surface of the protective package 14d.

Figure 10:
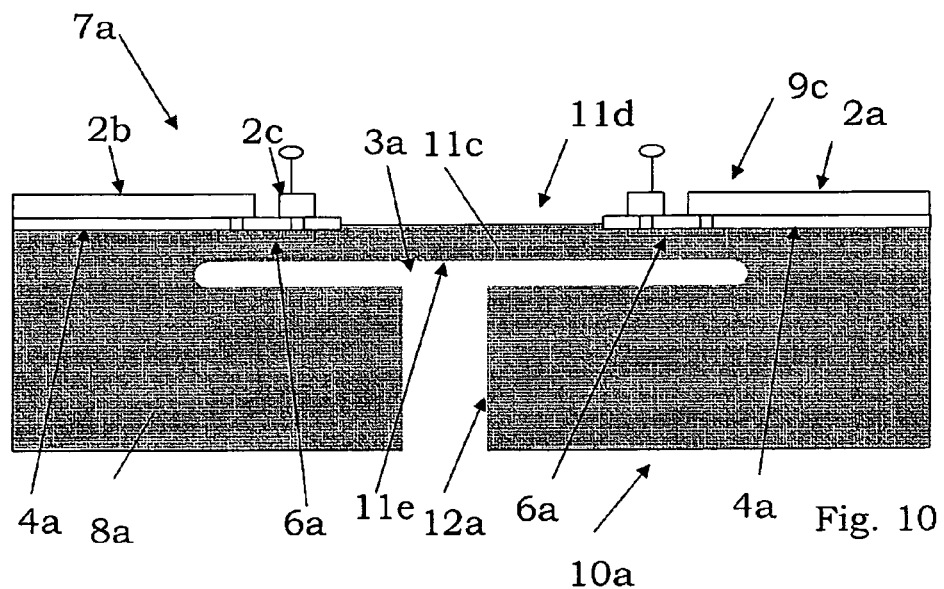
FIGS. 10 and 11 are sectional views of known MEMS differential pressure sensors.
Figure 11:
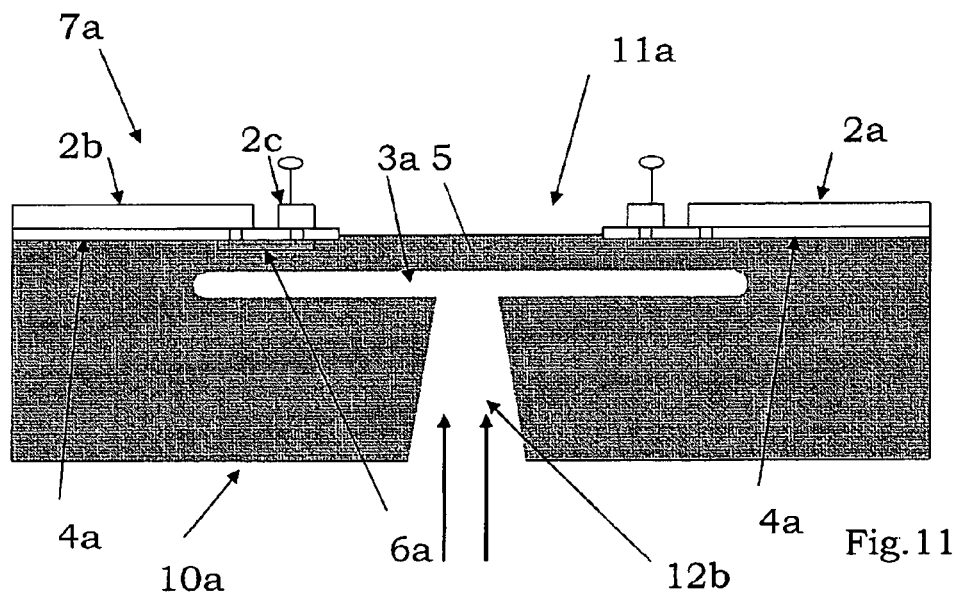

Advantageously, the MEMS differential sensor device 7 used in the devices according to embodiments of the disclosure is a differential pressure sensor device shown in FIGS. 10 and 11.

In particular, with reference to these figures, a differential pressure sensor 7a is shown formed in a semiconductor die 8a, for example of silicon.

In the semiconductor die 8a a cavity 3a is realized next to a first surface 9c of the semiconductor die 8a.

The portion of the semiconductor die 8a comprised between the cavity 3a and the first surface 9c forms a membrane 11c, i.e. the sensitive element of the pressure sensor 7a.

Resistive elements 6a are formed in the peripheral portion of the membrane 11c next to the first surface 9c.

An insulating layer 4a, for example oxide, coats the first active surface 9c of the die 2a, leaving a first active surface 11d of the membrane 11c, comprised between the resistive elements 6a, exposed. Moreover, openings are provided in the insulating layer 4a in correspondence with these resistive elements 6a for allowing the electric connection to a conductive layer 2a which is formed on the insulating layer 4a.

Nothing forbids that the insulating layer coats the whole active surface 9c of the die 2a.

Advantageously, a passivation layer coats the first active surface 9c of the die 2a.

In particular, the conductive layer 2a comprises two portions 2b and 2c separated from each other and electrically coupled through the resistive elements 6a.

An opening 12a, 12b is provided in a second surface 10a of the sensor 7a, opposed to the first surface 9c, which puts the cavity 3a in communication with the outside of the sensor 7a. In this way the opening 12a, 12b realizes an access gate for a second pressure which acts on the second active surface 11e of the membrane 11c which is faced in the cavity 3a.

As shown in FIG. 10, if the opening 12a is realized through a dry etching, the walls of the opening 12a are substantially perpendicular with respect to the second surface 10a, i.e. the cross dimensions of the opening 12a are substantially constant.

As shown in FIG. 11 instead, if the opening 12b is realized through an etching of the wet type the walls of the opening 12b are tapered, i.e. the cross dimensions of the opening 12b decrease when departing from the second surface 10a.

In conclusion, with the device according to embodiments of the disclosure it is possible to realize microphones, pressure, gas, chemical differential sensors, which are encapsulated in a protective package realized through molding.

According to embodiments of the disclosure it is also possible to integrate more sensors (accelerometers and pressure sensors) in the same protective package 14. These packages can be contained in a variety of different types of electronic systems, such as vehicle safety systems, portable electronic devices like cellular phones and PDAs, video game controllers, computer systems, control systems, and so on.

Advantageously, in a preferred embodiment, the overall electronic device 1, 1a, 1b, 1c, 1d, 1e, 1e shows a space comprised between 3×3×1 mm^3, while the MEMS differential sensor device 7 shows a width of 1500 μm a length of 1500 μm and a thickness 700 μm and shows an opening 12 on the second surface 10 comprised between 100 and 500 μm.

The sensitive portion 11 of the MEMS differential sensor device 7 is of circular or squared shape and has a diameter/side comprised between 100 μm and 1000 μm.

The distance between the first surface 9 of the MEMS differential sensor device 7 and the upper surface 3 of the substrate is comprised between 50 and 500 μm, while the thickness of the substrate 2 is comprised between 150 and 300 μm, while the width of the opening 5 is comprised between 100 and 700 μm.

If the barrier element 15 is realized by a ring of welding paste it has a thickness of a cross section comprised between 60 and 300 μm.

If the barrier element 15a, 15b is realized by an irregular area, it has a width of a cross section comprised between 10 and 50 μm and for example a depth comprised between 20 and 80 μm.

In conclusion, the electronic device according to embodiments of the disclosure is particularly compact and uses technical solutions which do not provide critical alignments.

Advantageously, the presence of the barrier element 15, 15a, 15b allows protection of the sensitive portion 11 of the MEMS differential sensor device 7 during the manufacturing steps of the protective package 14 or during the dispensing step of the underfiller 16 in the electronic device 1 according to embodiments of the disclosure.

Advantageously, this barrier element 15, 15a, 15b can be of physical or chemical nature or a combination of the two and can be realized both on the substrate 2 and on the MEMS differential sensor device 7.

From the foregoing it will be appreciated that, although specific embodiments of the disclosure have been described herein for purposes of illustration, various modifications may be made without deviating from the spirit and scope of the disclosure.

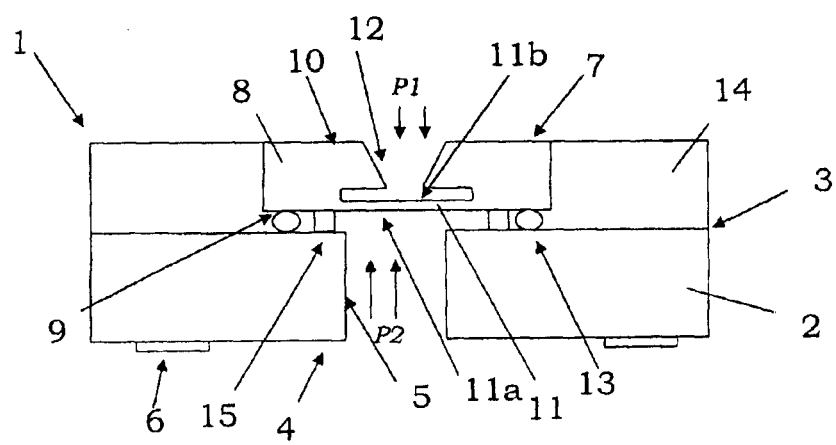

The invention claimed is:

1. An electronic device, comprising:
a substrate provided with at least one passing opening,
a MEMS device with function of differential sensor provided with a first and a second surface comprising at least one portion sensitive to chemical and/or physical variations of fluids present in correspondence with a first and second opposed active surface thereof, said first surface of said MEMS device leaving said first active surface exposed and said second surface being provided with a further opening which exposes said second active opposed surface, wherein said first surface of said MEMS device faces said substrate and is spaced therefrom by a determined distance, said sensitive portion being aligned to the at least one passing opening of said substrate,
the MEMS device further comprising a protective package, which incorporates at least partially said MEMS device and said substrate so as to leave said first and second opposed active surfaces exposed respectively through said passing opening of said substrate and said further opening of said second surface.

2. The electronic device according to claim 1, further comprising a barrier element which surrounds said sensitive portion for realizing a protection structure for said MEMS differential sensor device, so that said first active surface of said sensitive portion is free.

3. The electronic device according to claim 2, wherein said barrier element is a ring in contact with said upper surface of said substrate and said first surface of said MEMS device, and whose external edge is completely coated by said protective package.

4. The electronic device according to claim 2, wherein said barrier element is of welding paste.

5. The electronic device according to claim 2, comprising electric connections which electrically couple said MEMS differential sensor device to said substrate are present outside said barrier element with respect to said sensitive portion.

6. The electronic device according to claim 1, wherein an underfiller incorporates said electric connections.

7. The electronic device according to claim 6, wherein a barrier element protects the sensitive portion during the formation of said underfiller.

8. The electronic device according to claim 6, wherein said underfiller shows a tapered profile outside said peripheral area, while it shows a substantially vertical profile in correspondence with said area which surrounds said sensitive portion.

9. The electronic device according to claim 2, wherein said barrier element is an irregular area formed on the upper surface of the substrate.

10. The electronic device according to claim 9, wherein this irregular area extends on the upper surface of said substrate in correspondence with said sensitive portion.

11. The electronic device according to claim 9, wherein this irregular area is obtained by modifying the chemical properties of the upper surface of the substrate.

12. The electronic device according to claim 9, wherein said irregular area is formed by non wettable material.

13. The electronic device according to claim 2, wherein said barrier element is an irregular area formed on said first surface of the MEMS differential sensor device.

14. The electronic device according to claim 13, wherein this irregular area extends on the sensitive portion of the MEMS differential sensor device.

15. The electronic device according to claim 13, wherein this irregular area is obtained by modifying the chemical properties around said first surface of the MEMS differential sensor device.

16. The electronic device according to claim 13, wherein said irregular area is formed by non wettable material.

17. The electronic device according to claim 16, wherein said first active surface of said sensitive portion is coated by a non wettable insulating layer and a protection layer, wherein said irregular area is formed through removal of said protection layer from said first surface of the MEMS differential sensor device for exposing said layer of non wettable material.

18. The electronic device according to claim 17, wherein said protection layer is Polyimide and said layer of non wettable material is oxide.

19. The electronic device according to claim 13, wherein said irregular area comprises trenches which form preferred paths during the formation steps of the protective package.

20. The electronic device according to claim 19, wherein a layer of non wettable material is formed in correspondence with said sensitive portion of said MEMS differential sensor device.

21. The electronic device according to claim 13, wherein said electric connections comprise bumps.

22. The electronic device according to claim 1, wherein said MEMS differential sensor device is mounted on said substrate through the known "flip-chip" assembling method.

23. The electronic device according to claim 1, further comprising integrated circuits mounted flanked to the MEMS differential sensor device.

24. The electronic device according to claim 23, wherein said integrated circuits are electrically connected to conductive tracks present on said substrate, by means of further electric connections.

25. The electronic device according to claim 24, wherein said protective package incorporates said integrated circuits and said further electric connections.

26. The electronic device according to claim 1, wherein said substrate is of the LGA type.

27. The electronic device according to claim 1, wherein said substrate is of the BGA type.

28. The electronic device according to claim 1, wherein said MEMS differential sensor device is a pressure sensor.

29. The electronic device according to claim 1, wherein said MEMS device is a gas sensor.

30. The electronic device according to claim 1, wherein said MEMS device is a chemical sensor.

31. The electronic device according to claim 1, wherein said protective package is realized through molding.

32. The electronic device according to claim 1, wherein said protective package also coats said second surface and is provided with a passing opening aligned to the opening present on said second surface of said MEMS differential sensor device.

33. The electronic device according to claim 32, wherein a cylindrical projection is formed on said passing opening of said protective package to facilitate the access to said sensitive portion of said MEMS differential sensor device.

34. An electronic device, comprising:
a substrate having at least one passing opening;
a differential sensor MEMS device having at least a first and a second surface leaving exposed a first and second active surface, respectively;
a protective package incorporating at least partially said MEMS device and said substrate so as to leave exposed said first and second active surfaces;
said differential sensor having a portion being sensitive to chemical and/or physical variations of fluids getting in contact with said first and/or second active surface;
said first surface of said MEMS device facing said substrate and being spaced from said substrate by a distance;
said second surface being opposed to said first surface and having an opening for exposing said second active surface;
said sensitive portion being aligned with said passing opening of said substrate.

35. An electronic device, comprising:
a substrate having at least one passing opening formed in the substrate, the passing opening being exposed on a first surface of the substrate and on a second surface of the substrate opposing the first surface, and the substrate including at least one electrically conductive layer;
a differential sensor device including a die having first and second opposing surfaces including first and second active surface portions, respectively, wherein the first surface of the die faces the first surface of the substrate and is spaced a distance from the first surface of the substrate, the second surface of the die having an opening to expose the second active surface portion of the die and the die being physically attached to the substrate to align the first active surface portion of the die with the passing opening of the substrate, and the die being electrically connected to at least some of the electrically conductive layers in the substrate; and
a protective package formed on the substrate and die, the package leaving the first and second active surface portions of the die exposed.

36. The electronic device of claim 18, wherein the die of the differential sensor device comprises a semiconductor die.

37. The electronic device of claim 19, wherein the opening in the die has wall that are substantially orthogonal to the second surface of the die.

38. The electronic device of claim 19, wherein the opening in the die has walls that taper inwardly from the second surface of the die towards the first surface of the die.

39. The electronic device of claim 35, wherein the die includes conductive lands exposed on portions of the first surface of the die other than the first active surface portion of the die.

40. The electronic device of claim 39, wherein the die is electrically connected to at least some of the electrically conductive layers in the substrate through the conductive lands and conductive bumps formed between the lands and conductive lands formed on the first surface of the substrate.

41. The electronic device of claim 39, wherein the second surface of the substrate includes conductive lands formed thereon.

42. The electronic device of claim 35, wherein the protective package covers a portion of the second surface of the die and includes a further passing opening formed in the package, the further passing opening being aligned with the opening in the second surface the die to expose the second active surface portion.

43. The electronic device of claim 42, wherein the further passing opening is a cylindrical projection formed in the protective package.

44. An electronic system, comprising:
a plurality of electronic devices formed on a substrate, the substrate including, for at least some of the electronic devices, a passing opening formed in the substrate, the passing opening being exposed on a first surface of the substrate and on a second surface of the substrate opposing the first surface, and the substrate including at least one electrically conductive layer;
wherein the electronic devices include a plurality of differential sensor devices, each differential sensor device including a die having first and second opposing surfaces including first and second active surface portions, respectively, wherein the first surface of the die faces the first surface of the substrate and is spaced a distance from the first surface of the substrate, the second surface of the die having an opening to expose the second active surface portion of the die and the die being physically attached to the substrate to align the first active surface portion of the die with a corresponding one of the passing openings in the substrate, and the die being electrically connected to at least some of the electrically conductive layers in the substrate; and a protective package formed on the substrate and the electronic devices, the package leaving the first and second active surface portions of the die of each differential sensor device exposed.

45. The electronic system of claim 44 where in at least some of the electronic devices comprise MEMS devices.

46. The electronic system of claim 45 wherein at least some of the MEMS devices comprise pressure sensors.

47. The electronic system of claim 45 wherein at least some of the MEMS devices comprise accelerometers.

48. The electronic system of claim 44 wherein the electronic devices including the differential pressure sensor devices collectively function as a one of a vehicle safety system, cellular telephone, personal digital assistant, video game controller, computer system, and control system.

* * * * *

UNITED STATES PATENT AND TRADEMARK OFFICE
CERTIFICATE OF CORRECTION

Page 1 of 2

PATENT NO. : 8,134,214 B2
APPLICATION NO. : 12/508869
DATED : March 13, 2012
INVENTOR(S) : Lorenzo Baldo, Chantal Combi and Mario Francesco Cortese It is certified that error appears in the above-identified patent and that said Letters Patent is hereby corrected as shown below:

The Title page, should be deleted and substitute therefor the attached title page.

In the Claims

Column 10, line 28, for the claim reference numeral '1', should read -5-.

Column 12, line 21, for the claim reference numeral '18', should read -35-.

Column 12, line 23, for the claim reference numeral '19', should read -36-.

Column 12, line 26, for the claim reference numeral '19', should read -36-.

Column 14, after line 9, insert the following claim:

--49. The electronic device according to claim 1, wherein said second surface is flanked to an upper surface of said protective package.--.

Signed and Sealed this
Twenty-ninth Day of April, 2014

Michelle K. Lee
*Deputy Director of the United States Patent and Trademark Office*

United States Patent
Baldo et al.

(10) Patent No.: US 8,134,214 B2
(45) Date of Patent: Mar. 13, 2012

(54) ELECTRONIC DEVICE, SYSTEM, AND METHOD COMPRISING DIFFERENTIAL SENSOR MEMS DEVICES AND DRILLED SUBSTRATES

(75) Inventors: Lorenzo Baldo, Bareggio (IT); Chantal Combi, Oggiono (IT); Mario Francesco Cortese, Sa Donato Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 152 days.

(21) Appl. No.: 12/508,869

(22) Filed: Jul. 24, 2009

(65) Prior Publication Data

US 2009/0278215 A1 Nov. 12, 2009

Related U.S. Application Data

(63) Continuation-in-part of application No. PCT/EP2008/000495, filed on Jan. 23, 2008.

(30) Foreign Application Priority Data

Jan. 24, 2007 (IT) .......................... MI2007A0099

(51) Int. Cl.
*H01L 29/84* (2006.01)
(52) U.S. Cl. ................. 257/415; 257/680; 257/E21.001
(58) Field of Classification Search .................. 257/415, 257/680, E21.001
See application file for complete search history.

(56) References Cited

U.S. PATENT DOCUMENTS

| 4,763,098 A | 8/1988 | Glenn et al. |
| 2005/0253207 A1 | 11/2005 | Garcia |

FOREIGN PATENT DOCUMENTS

| DE | 10059813 | * | 6/2002 |
| DE | 10059813 | A1 | 6/2002 |
| EP | 1775259 | A1 | 10/2005 |
| WO | 9805935 | | 2/1998 |
| WO | 0029822 | | 5/2000 |
| WO | 03067657 | | 8/2003 |
| WO | 2006061025 | | 6/2006 |

OTHER PUBLICATIONS

European Patent Office, International Search Report, International Application No. PCT/EP2008/000495, Oct. 17, 2008, 6 Pages.

* cited by examiner

*Primary Examiner* — Tan N Tran
(74) *Attorney, Agent, or Firm* — Graybeal Jackson LLP

(57) ABSTRACT

Electronic device which comprises a substrate provided with at least one passing opening, a MEMS device with function of differential sensor provided with a first and a second surface and of the type comprising at least one portion sensitive to chemical and/or physical variations of fluids present in correspondence with a first and a second opposed active surface thereof, the first surface of the MEMS device leaving the first active surface exposed and the second surface being provided with a further opening which exposes said second opposed active surface, the electronic device being characterized in that the first surface of the MEMS device faces the substrate and is spaced therefrom by a predetermined distance, the sensitive portion being aligned to the passing opening of the substrate, and in that it also comprises a protective package, which incorporates at least partially the MEMS device and the substrate so as to leave the first and second opposed active surfaces exposed respectively through the passing opening of the substrate and the further opening of the second surface.

49 Claims, 4 Drawing Sheets